United States Patent [19]

Matsuzaki

[11] Patent Number: 5,864,182
[45] Date of Patent: Jan. 26, 1999

[54] BATTERY MOUNTED INTEGRATED CIRCUIT DEVICE

[75] Inventor: Kazuo Matsuzaki, Kawasaki, Japan

[73] Assignee: Fuji Electric Co., Ltd., Kawasaki, Japan

[21] Appl. No.: 148,271

[22] Filed: Nov. 8, 1993

[30] Foreign Application Priority Data

Nov. 9, 1992 [JP] Japan ................................. 4-297501

[51] Int. Cl.⁶ ........................ H01L 23/02; H01L 23/34; G11C 5/06; G11C 7/00
[52] U.S. Cl. ........................ 257/924; 257/724; 365/229; 365/226; 365/63
[58] Field of Search ................................. 257/666, 924, 257/694, 798, 724; 365/226, 229, 63, 228; 235/492; 328/258

[56] References Cited

U.S. PATENT DOCUMENTS 4,672,586  6/1987  Shimohigashi et al. ........... 365/189.09
5,153,710  10/1992  McCain ................................ 365/229

*Primary Examiner*—Mahshid D. Saadat
*Assistant Examiner*—Jhihan B. Clark
*Attorney, Agent, or Firm*—Finnegan, Henderson, Farabow, Garrett & Dunner, L.L.P.

[57] ABSTRACT

A battery mounted integrated circuit device comprises a semiconductor chip in which an integrated circuit including a plurality of power receiving circuits with different operating voltages is formed; a thin film laminated battery made of a solid electrolytic film mounted on the semiconductor chip for producing a plurality of voltages; and a power source switch incorporated in said integrated circuit for connecting said battery to the power receiving circuits to supply the plurality of voltages from the battery to the power receiving circuits on demand.

9 Claims, 1 Drawing Sheet

BATTERY MOUNTED INTEGRATED CIRCUIT DEVICE

BACKGROUND OF THE INVENTION

1. Field of the Invention

The present invention relates to an integrated circuit device in which a battery made of solid-state electrolyte is mounted on a semiconductor chip to supply power to the integrated circuit during usual time or power failure.

2. Discussion of the Related Art

With development of small-size, light-weight, and portable electronic devices, demands for battery power-supplies have been advanced to improve case of their use. Both primary and secondary batteries are used as the battery for a power supply. In both cases, the battery is required to be small-sized, light-weight and have long usable time. Usually, the battery uses a liquid electrolyte or an electrolytic layer impregnated with an electrolyte. However, since it must be sealed in a package, its bulk and weight increase. Such a battery is not suitable for portable electronic devices. For this reason, in recent years, attention has been paid to the future of the battery using solid electrolyte.

Previously known electrolytes suitable to such a battery include e.g. natrium-ion conductive ones of a gallia or alumina series (Japanese Patent Unexamined Publication No. Sho 57-27982), lithium-ion conductive ones of a lithium compound series (Japanese Patent Unexamined Publication Nos. Sho 59-31569, 59-31570 and 59-60866), copper-ion conductive ones such as a copper halide series and silver-ion conductive ones such as a silver compound series (Japanese Patent Unexamined Publication No. Sho 63-34864), and also includes several materials, particularly metal ion conductive ones. By stacking these solid electrolytic thin films several $\mu$ms or so thick together with a negative pole (cathode) metallic film and a metallic film for connection, a very thin battery in a thin film laminated structure of 10 $\mu$m thick or less, although now not having a large current capacity, can be made. Incidentally, since the conductivity of the solid electrolyte is a function of temperature, the current capacity of the battery can be improved by raising its operating temperature.

The above solid electrolytic battery is suitable for small power supplies. However, since the electronic devices in which such a battery is to be incorporated, particularly, portable ones are required to be downsized, the space in which the battery is to be provided must be minimized. Further, in many cases, in order to advance the function of the electronic device, a display and/or a printer is incorporated into the device, and driving capability for external loads may be added. For this reason, frequently, it is necessary to supply plural voltages to circuits within the electronic device. In order to supply these plural voltages, a DC-DC converter such as a known switching power source must be incorporated. However, its voltage conversion operation necessarily brings about power loss so that the life of the primary battery or the dischargeable time of the secondary battery will be shortened. A precious space must be also used to incorporate the converter.

On the basis of the fact that the solid electrolytic battery is suitable for supply small power, using it for back-up, i.e., as a power source during power failure of the normal power source for an electronic device, or during its movement time, makes it possible for the electronic device to hold the storage content of its RAM or to always maintain its sensing function. In this case, there is no problem involved with the converter for voltage conversion. However, if the secondary battery is used for back-up so that a necessary space inclusive of the circuit for its charge/discharge or power supply switching must be minimized.

SUMMARY OF THE INVENTION

The present invention has been conducted in view of the above problem or requirement, and it is an object of the invention to supply plural voltages without using any converter while diminishing the space required for a battery and its relevant circuits.

Another object of the invention is to rationally use the battery for back-up.

In accordance with the present invention, the above first object can be attained by mounting a battery provided with a solid electrolytic film and generating plural voltages on a semiconductor chip in which an integrated circuit including plural circuits with different operating voltages is formed, incorporating a power supply switch connecting the battery with its power receiving circuits in the integrated circuit, and operating the power supply switch on demand so that power can be supplied from the battery to each power receiving circuit. Additionally, the plural voltages can be taken out from a single battery as a matter of course. However, it is more advantageous from the viewpoint of improving comfort for use to separate the battery for each of the circuits with different operating voltages so that plural batteries are mounted on the chip.

Further, the above second object can be attained by mounting a battery using a solid electrolytic film on a semiconductor chip in which an integrated circuit is formed, incorporating a power supply switch connecting the battery with its power receiving circuit into the integrated circuit, previously charging the battery by a normal power source while the integrated circuit is operated by the normal power source and automatically operating the power supply switch during power failure so that power is supplied from the battery to the power receiving circuit. In this case, the battery is used as a secondary battery for back-up. The solid electrolytic battery is usually suitable for the secondary battery.

Both batteries for generating the plural voltage and for back-up, may be mounted on the chip in such a manner that they are packaged in the chip through a bump electrode. However, since the battery using solid electrolyte has a thin-film laminated structure, it is advantageous to form the battery on an insulating film covering a chip surface using semiconductor manufacturing technology. Further, in order to cause the battery to have a voltage suitable to its power receiving circuit, it is necessary to connect battery units in series. To this end, since the solid electrolyte is in a thin-film laminated structure, it is desired to adopt a laminated battery structure electrolytic battery in which multiple thin films including the solid electrolytic film of the battery unit are stacked. Only when there are too many layers to be stacked, it is better to divide the structure into plural parts to be connected in series.

In the present invention, using the fact that a solid electrolytic battery is a thin film type having a thin-film laminated structure, the battery is mounted on the chip of an integrated circuit device to which power is to be supplied and an attached power source switch is incorporated within the integrated circuit so that the space for them can be saved. Further, using the fact that the battery has a sufficiently good constant voltage characteristic during its life and sufficient discharge time, the power source switch has only to be operated as necessity arises without using a voltage converter so that stabilized voltage can be supplied to power receiving circuits.

Therefore, in the present invention, even when the integrated circuit includes plural circuits with different operating voltages, a battery is provided for each power receiving circuit, or otherwise, using the fact that the battery is composed of a series connection of battery units, different voltages are taken out from a single battery so that plural voltages for supplying power to plural circuits are generated in the battery(s) itself. Further, where the battery is used for back-up for a normal power source, it is not necessarily required that these plural voltages are generated; on the other hand, a circuit for automatically operating the power source switch is required. Such a relevant circuit, together with the power source switch, can be easily incorporated in the integrated circuit.

BRIEF DESCRIPTION OF THE DRAWINGS

The accompanying drawings, which are incorporated in and constitute a part of this specification, illustrate embodiments of the invention and, together with the description, serve to explain the objects, advantages and priciples of the invention. In the drawings.

DETAILED DESCRIPTION OF THE PREFERRED EMBODIMENTS

Figure 1A:
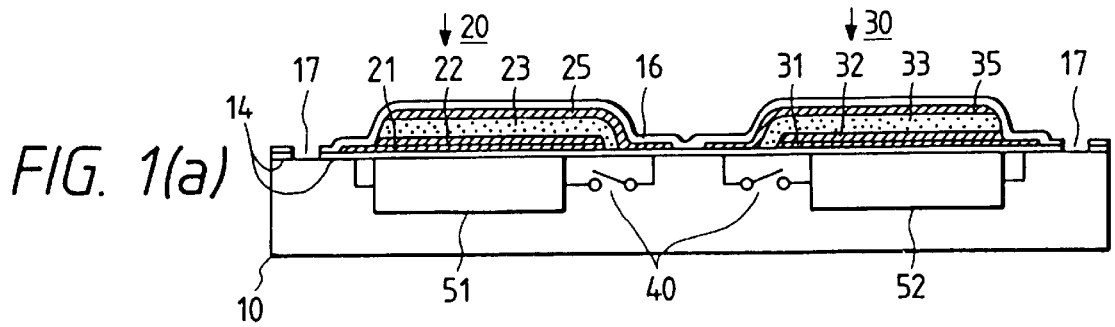
FIG. 1(a) is a sectional view of a battery mounted integrated circuit device according to an embodiment of the present invention.

Now referring to the drawings, an explanation will be given of embodiments of the present invention.

Figure 1B:
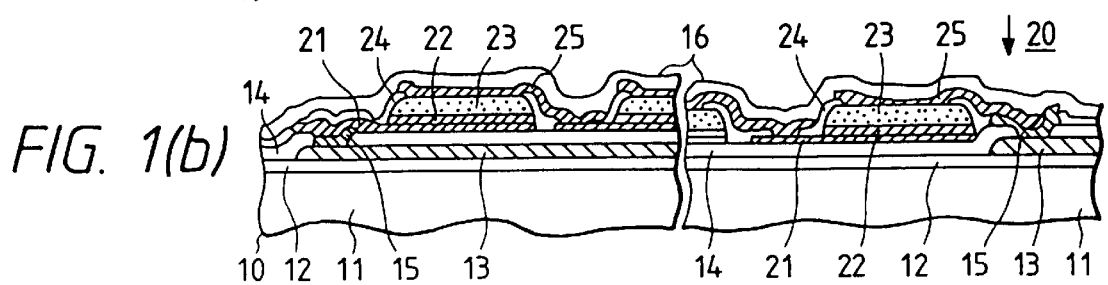
FIG. 1(b) is an enlarged sectional view of the main portion of a battery with battery units connected in series.
Figure 1C:
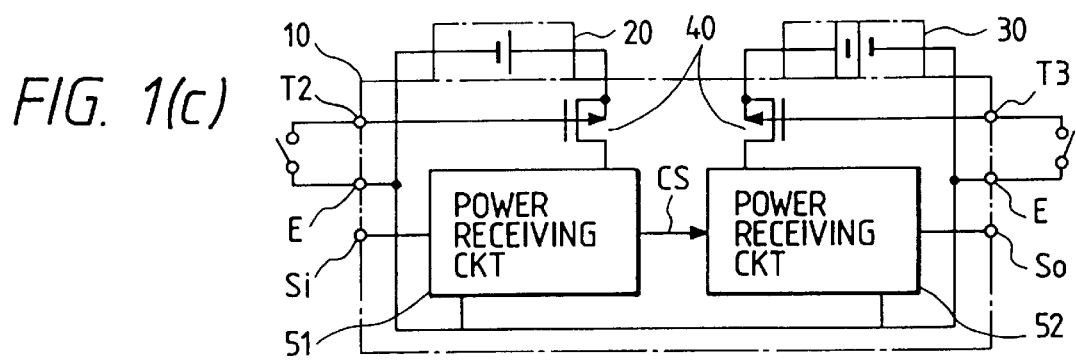
FIG. 1(c) is a circuit diagram corresponding to the device of FIG. 1(a)

FIGS. 1(a) to 1(c) show an integrated circuit including plural circuits with different operating voltages in its sectional view, enlarged sectional view and circuit configuration, respectively. Incidentally, in these embodiments, although it is assumed that the battery is a secondary battery, the present invention can be also applied to where a primary battery is used.

In a semiconductor chip 10 shown in FIG. 1(a), an integrated circuit including circuits 51 and 52 with different operating voltages is formed. As shown in FIG. 1(c), the circuit 51 is a MOS circuit which operates at a low voltage of e.g. 5 V in response to a signal from an input terminal Si. The circuit 52 is an output circuit composed of MOS transistors which, in response to a control signal CS from the MOS circuit 51, operates at a voltage of e.g. 10 V or more to drive load through an output terminal So. In order that respective voltages suitable to the power receiving circuits 51 an 52 are supplied to them, in this embodiment, as shown in FIG. 1(a), small-sized batteries 20 and 30 of several mm (millimeter) square are individually formed so that they are located on the upper side of an insulating film 14 of e.g. silicon oxide covering the surface of the semiconductor chip 10.

In the present invention, these batteries 20 and 30 are usually constituted by solid electrolyte batteries, and also laminated batteries. To avoid complexity, in FIG. 1(a), they are illustrated as a single-layer battery. For example, for the battery 20 for 5 V, copper (Cu) ion conductive solid electrolyte is used, while for the battery 30 for 10 V, lithium (Li) ion conductive solid electrolyte is used. The battery 20 is composed of a connection metallic film 21 of gold-chrome (Au—Cr) having a thickness of 0.1 $\mu$m, a negative pole (cathode) metallic film 22 of copper (Cu) having a thickness of 0.2–0.5 $\mu$m, a solid electrolytic film 23 of e.g. copper halide having a thickness of 2-several $\mu$m and a connection metallic film 25 of Au having a thickness of 0.1 $\mu$m. These films are successively formed on the insulating film 14 from the lower side of the drawing and in a predetermined pattern. Thus, the resultant battery provides a single-layer battery voltage of 0.5–0.65 V.

Similarly, the battery 30 is composed of a connection metallic film 31 of gold-chrome (Au—Cr) having a thickness of 5 0.1 $\mu$m, a negative pole (cathode) metallic film 32 of Li having a thickness of 0.1–0.3 $\mu$m, a solid electrolytic film 33 of lithium halide having a thickness of 2-several $\mu$m and a connection metallic film 35 of Au having a thickness of 0.1 $\mu$m. These films are formed successively and in a predetermined pattern. Thus, a battery with a single-layer voltage of 2.6–3.0 V is completed. Additionally, in both batteries 20 and 30, their constituent thin films can be consecutively formed by the number of layers required for a laminated battery structure by means of vacuum evaporation, sputtering or the like. In order to form the laminated structure in a predetermined pattern, it is advantageous to deposit a photoresist film on the portion other than an area where the laminated structure is to be formed, successively to form films thereby completing the laminated structure and to dissolve the photoresist film thereby removing unnecessary portions by so-called lift-off techniques. As understood from the drawing, it should be noted that separate patterning is required for the connection metallic films as the lowermost and uppermost layers. After these batteries 20 and 30 are formed on the chip 10, the entire surface is covered with a protective film 16 made of e.g. silicon nitride, and windows are made in the periphery to form connection pads 17 for the integrated circuit.

As described above, it is advantageous that the battery is constituted by a laminated battery, however, if the number of the layers to be stacked is too many, it becomes difficult to form the laminated structure. For this reason, it is preferable to divide the structure into a plurality of unit batteries to be connected in series.

FIG. 1(b) shows the structure in this case in its partially enlarged view of battery 20 inclusive of how the battery is connected to the integrated circuit. For convenience of illustration, each unit battery is shown in the form of a single-layer battery as in the previously case. On the side of the chip 10 on which the battery 20 is mounted, the surface of a semiconductor area 11 in which the integrated circuit is formed is covered with an insulating film 12, an aluminum wiring layer 13 provided on the insulating film 12 is covered with an insulating film 14 of e.g. silicon oxide having a thickness of 1 $\mu$m, and a metallic connection film 15 made of aluminum is provided at a connection window with the battery 20 which is made at a predetermined portion of the insulating film 14.

In the unit battery on the left side of FIG. 1(b), the lower connection metallic film 21 is extended so as to be connected to the wiring film 13 for the integrated circuit through the connection film 15. The solid electrolytic film 23 on the uppermost layer side of each unit battery is covered with a thin insulating film 24, and a window is made at a predetermined portion of the insulating film 24. Within this window, the solid electrolytic film 23 is connected, through the upper connection metallic film 25 in electrical contact with it, to the lower connection metallic film 21 of the adjacent unit battery. Thus, the unit batteries are connected with each other. On the other hand, in the unit battery on the right side of the drawing, the upper connection metallic film 25 is connected to the wiring film 13 through the upper connection film 15. Thus, the internal connection of the battery 20 and its connection with the integrated circuit within the chip 10 are completed. The entire surface is covered with the above-mentioned protection film 16, which results in the state as shown.

As shown in FIG. 1(a), the batteries 20 and 30 formed in the semiconductor chip 10 have a positive pole (anode) on their upper side and a negative pole (cathode) on their lower side. In the embodiment, the positive poles are connected to the power receiving circuits 51 and 52 through power source switches 40, respectively, while the negative poles are connected with ground terminal E as shown in FIG. 1(c). The power source switches 40 are constituted by p-channel MOS transistors. With their gates connected to ground, when they are turned on through power control terminals T2 and T3. Power can be supplied from the batteries 20 and 30 to the power receiving circuits 52 on demand. In this example, the batteries 20 and 30 which are secondary batteries can discharge for several tens of hours although the period depends on the kind of the solid electrolyte. Further, since the discharge rate is substantially constant in the case of the load for an electronic circuit, the generated voltage can be maintained constant during a discharge permissible time with the precision within ±1% which is substantially equal to that in a converter.

Figure 2:
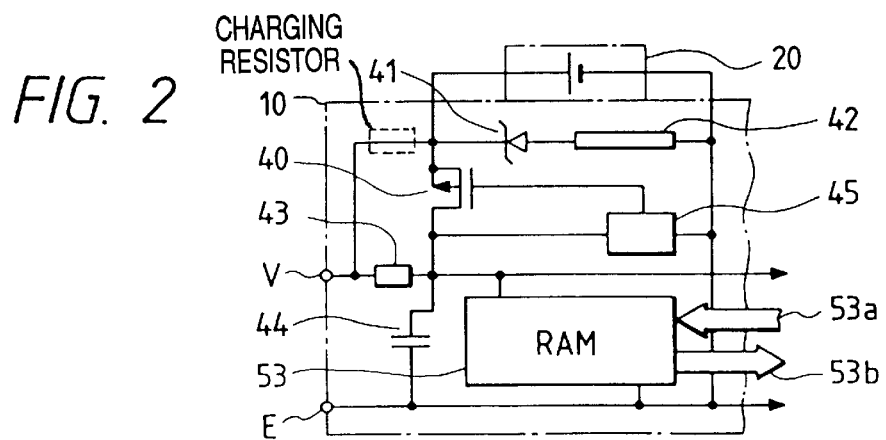
FIG. 2 is a circuit diagram according to another embodiment of the present invention where a battery is used for back-up.

In the embodiment of FIG. 2, the battery 20 is used for back-up when there occurs power failure of a normal power source. What is subjected to back-up in the embodiment is a RAM 53 within the chip 10, and only the portion related to it is shown in the chip 10. In this embodiment, while a regular power source voltage V is normal, the battery 20 is charged so that the voltage V is supplied to the battery 20. In addition, a Zener diode 41 for prevention for overcharging and a resistor 42 in series with the Zener diode 41 are incorporated in the integrated circuit within the chip 10. As in the previous case, the voltage from the battery 20 is supplied to the RAM 53, which is a charging circuit, through a power source switch 40 formed of a MOS transistor. The power source voltage V is also supplied to the RAM 53 through a low resistor 43. A capacitor 44 is provided between the switch 40 and ground terminal E. Further, a low voltage detecting circuit 45 which always monitors the voltage received by the RAM 53 is provided to control the gate of the MOS transistor for the power source switch 40.

In this embodiment, as long as the regular power source voltage V is normal, the RAM 53 carries out its ordinary operation through its address bus 53a and data bus 53b and the battery 20 is always maintained in the charged state. However, when the voltage received by the RAM 53 lowers from a predetermined value by e.g. 10–20% owing to any cause such as power failure, the low voltage detecting circuit 45 detects this fact to turn on the power source switch 40. Thus, the RAM 53 is supplied with the voltage from the battery 20 so that its storage contents are held. Incidentally, the capacitor 44 serves to protect the storage contents while power supply is switched or when the power source voltage V is stopped for a moment. In this embodiment, the battery 20 may be a small-sized type having a small current capacity and is also a charging-discharging type so that the battery 20 has a more complete protection function than an ordinary primary battery. This embodiment is also useful in always operating e.g. a sensor circuit for monitoring as well as RAM.

The present invention can be put into practice in several kinds of manners as well as the above embodiments. For example, in the embodiment of FIG. 1, although a battery is provided for each of the power receiving circuits with different operating voltages, if the battery is composed of battery units connected in series as shown in FIG. 1(b), plural voltages can be easily extracted from a single battery. In this case, even if different current values are required for different power receiving circuits, the areas in which the battery units are to be formed may be set in accordance with the different current values.

As described above, in a battery mounted integrated circuit device according to the present invention, a solid electrolytic battery generating plural voltages is provided on a semiconductor chip in which an integrated circuit including plural circuits with different operating voltages is formed, a power supply switch connecting the battery with its power receiving circuits is incorporated in the integrated circuit, and the power supply switch is operated so that power can be supplied from the battery to each power receiving circuit. Otherwise, a solid electrolytic battery is provided on a semiconductor chip in which an integrated circuit is formed, a power supply switch connecting the battery with its power receiving circuit is incorporated into the integrated circuit, the battery is previously charged by a regular power source while the integrated circuit is operated by the regular power source and the power supply switch is automatically operated during power failure so that power is supplied from the battery to the power receiving circuit. As a result, the following effects can be obtained.

(a) The solid electrolytic battery, which has a thin film laminated structure, can be a very thin type even if it is formed as a laminated battery. By mounting such a battery on a semiconductor chip of the integrated circuit device, in incorporating it in a portable electronic device power supplied from the battery, it is not necessary to allowing space for the battery. Further, the power source switch connecting the battery with its power receiving circuits is also incorporated in the integrated circuit so that the space therefor is not necessary.

(b) Since a battery is mounted for each of the power receiving circuits with different operating voltages instead of a single battery used to generate different voltages, it is not necessary to use a converter for converting a single battery voltage into plural voltages. The space can be saved to that degree and power loss due to power conversion can be made zero so that the life of the battery or discharge permissible time can be extended. The battery using a solid electrolyte, as long as it does not have so large a discharge rate within its life or discharge permissible time, has a good constant voltage characteristic which is equal to a battery provided using a converter.

(c) By using the solid electrolyte battery as a secondary battery of a charging-discharging type for back-up for a usual power source, permanent back-ups with higher reliability than an ordinary primary battery can be realized. Related circuits for power switching can be incorporated together with the power source switch so that the space therefore is not necessary.

(d) The conductivity rate of the solid electrolyte can be improved with an increase in temperature so that by mounting the solid electrolyte battery on a semiconductor chip, its operating temperature can be slightly increased to improve the current capacity.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A battery mounted integrated circuit device, comprising:
    a semiconductor chip in which an integrated circuit including a plurality of power receiving circuits with different operating voltages is formed;
    a thin film laminated battery, made of a solid electrolytic film mounted on said semiconductor chip, for producing a plurality of voltages; and
    a power source switch incorporated in said integrated circuit for connecting said battery to said power receiving circuits to supply said plurality of voltages from said battery to said power receiving circuits on demand.

2. A device as claimed in claim 1, wherein said battery is provided for each of the power receiving circuits with different operating voltages.

3. A device as claimed in claim 1, wherein said battery comprises a plurality of battery units connected in series with each other.

4. A device as claimed in claim 1, wherein each of said plurality of voltages corresponds to a respective one of the different operating voltages.

5. A battery mounted integrated circuit device, comprising:
    a semiconductor chip in which an integrated circuit including at least one power receiving circuit is formed;
    a normal power source for supplying power to said integrated circuit;
    a thin film laminated battery made of a solid electrolytic film mounted on said semiconductor chip; and
    a power source switch incorporated in said integrated circuit for connecting said battery to said at least one power receiving circuit;
    wherein said battery is previously charged by said normal npower source while said integrated circuit is being operated by said normal power source, and during power failure, said power source switch is automatically operated so that power is supplied from said battery to said at least one power receiving circuit.

6. A device as claimed in claim 5, further comprising a low voltage detection circuit for detecting that voltage supplied from said normal at least one power source to said at least one power receiving circuit is lower than a predetermined value to turn on said power source switch.

7. A device as claimed in claim 5, wherein said at least one power receiving circuit comprises a RAM.

8. A device as claimed in claim 5, wherein said at least one power receiving circuit comprises a sensor circuit.

9. A device as claimed in claim 7, further comprising a capacitor incorporated in said integrated circuit for protecting a storage contents of said RAM during one of power switching and power failure.

* * * * *

UNITED STATES PATENT AND TRADEMARK OFFICE
CERTIFICATE OF CORRECTION

PATENT NO. : 5,864,182
DATED : January 26, 1999
INVENTOR(S) : Matsuzaki It is certified that error appears in the above-identified patent and that said Letters Patent is hereby corrected as shown below:

Claim 5, column 8, line 15, "npower" should read --power--.

Claim 6, column 8, line 22, after "normal", delete "at least one".

Signed and Sealed this

Twenty-third Day of November, 1999

Attest:

Q. TODD DICKINSON

*Attesting Officer*     *Acting Commissioner of Patents and Trademarks*